United States Patent
Kwon et al.

(10) Patent No.: US 6,344,285 B1
(45) Date of Patent: Feb. 5, 2002

(54) ORGANIC ELECTROLUMINESCENCE DEVICE

(75) Inventors: Soon-ki Kwon, Chinju; Yun-hi Kim; Young-inn Kim, both of Pusan; Han-sung Yu, Anyang; Sung-hyun Cho, Seoul, all of (KR)

(73) Assignee: Samsung Display Devices Co., Ltd., Suwon (KR)

( * ) Notice: Subject to any disclaimer, the term of this patent is extended or adjusted under 35 U.S.C. 154(b) by 0 days.

(21) Appl. No.: 09/340,055

(22) Filed: Jun. 28, 1999

(30) Foreign Application Priority Data

Nov. 12, 1998 (KR) ............................................. 98-48406

(51) Int. Cl.⁷ ............................................... H05B 33/14
(52) U.S. Cl. ........................ 428/690; 428/917; 428/704
(58) Field of Search .................. 428/690, 704, 428/917; 313/504, 506

(56) References Cited

U.S. PATENT DOCUMENTS

| | | | | |
|---|---|---|---|---|
| 4,537,826 A | * | 8/1985 | Miyamura et al. | 428/328 |
| 5,231,329 A | * | 7/1993 | Nishikitani et al. | 313/503 |
| 5,281,489 A | * | 1/1994 | Mori et al. | 428/690 |
| 5,393,614 A | * | 2/1995 | Nakada | 428/690 |
| 5,807,974 A | * | 9/1998 | Kim et al. | 528/366 |
| 5,814,416 A | * | 9/1998 | Dodabalapur et al. | 428/690 |
| 5,834,130 A | * | 11/1998 | Kido | 428/690 |
| 5,858,563 A | * | 1/1999 | Sano et al. | 428/690 |

OTHER PUBLICATIONS

Polymer Data Handbook, edited by James E. Mark, 1999, p. 655–657.*

* cited by examiner

*Primary Examiner*—Cynthia H. Kelly
*Assistant Examiner*—Ling Xu
(74) *Attorney, Agent, or Firm*—Leydig, Voit & Mayer, Ltd.

(57) ABSTRACT

An organic electroluminescence (EL) device including an electron transport layer formed between a pair of electrodes, wherein the electron transport layer contains 50~99.9 wt % of alcohol-soluble polymer and 0.1~50 wt % of electron transporting material. In the EL device according to the present invention, the electron transport layer can be formed through a spin-coating without damage to the light-emitting layer. Thus, the manufacture process for the organic EL device is simplified, and the time and cost required for the manufacture are reduced.

5 Claims, 1 Drawing Sheet

ORGANIC ELECTROLUMINESCENCE DEVICE

BACKGROUND OF THE INVENTION

1. Field of the Invention

The present invention relates to an organic electroluminescence (EL) device, and more particularly, to an organic EL device which is simply manufactured by forming an electron transport layer by a spin-coating method.

2. Description of the Related Art

An EL device as a spontaneous luminescence type display has a broad viewing angle, good contrast and response time characteristics. Due to these merits, the EL device has been the focus of next generation displays.

The EL device is classified into an inorganic EL device and an organic EL device depending on the material used for a light-emitting layer. In particular, the organic EL device has good luminance, driving voltage and response time, and can display a multitude of colors.

FIG. 1 is a section view showing the structure of a general EL device. Referring to FIG. 1, an anode 12 is formed on a substrate 11. A hole transport layer 13, a light-emitting layer 14, an electron transport layer 15, and a cathode 16 are formed on the anode 12 in sequence. Here, the hole transport layer 13, the light-emitting layer 14 and the electron transport layer 15 are organic thin films made of an organic compound.

The organic EL device having the above structure operates based on the following operation principle. When a voltage is applied between the anode 12 and the cathode 16, holes injected from the anode 12 move through the hole transport layer 13 to the light-emitting layer 14. Meanwhile, electrons are injected from the cathode 16 through the electron transport layer 15 to the light-emitting layer 14. Also, carriers are recoupled in the light-emitting layer 14 to generate excitons. The excitons are transited from an excited state to a ground state, so that fluorescent molecules of the light-emitting layer emit light to form a picture.

Also, in general, the electron transport layer is formed of quinolinol complex, benzoquinolinol complex, 1,3,4-oxadiazole derivative, triazole derivative or phenanthroline derivative.

However, when the electron transport layer is formed of the compounds, using a spin coating method is not possible. That is, only a vapor-deposition method should be used. This is because the light-emitting layer is damaged by the solvent used for spin-coating the compounds.

SUMMARY OF THE INVENTION

To solve the above problems, it is an object of the present invention to provide an organic electro-luminescence (EL) device which is simply manufactured by forming an electron transport layer by a spin-coating method.

To achieve the above object, there is provided an organic electroluminescence (EL) device comprising an electron transport layer formed between a pair of electrodes, wherein the electron transport layer comprises 50~99.9 wt % of alcohol-soluble polymer and 0.1~50 wt % of electron transporting material.

BRIEF DESCRIPTION OF THE DRAWING

The above object and advantages of the present invention will become more apparent by describing in detail preferred embodiments thereof with reference to the attached drawings in which.

DESCRIPTION OF THE PREFERRED EMBODIMENTS

Figure 1:
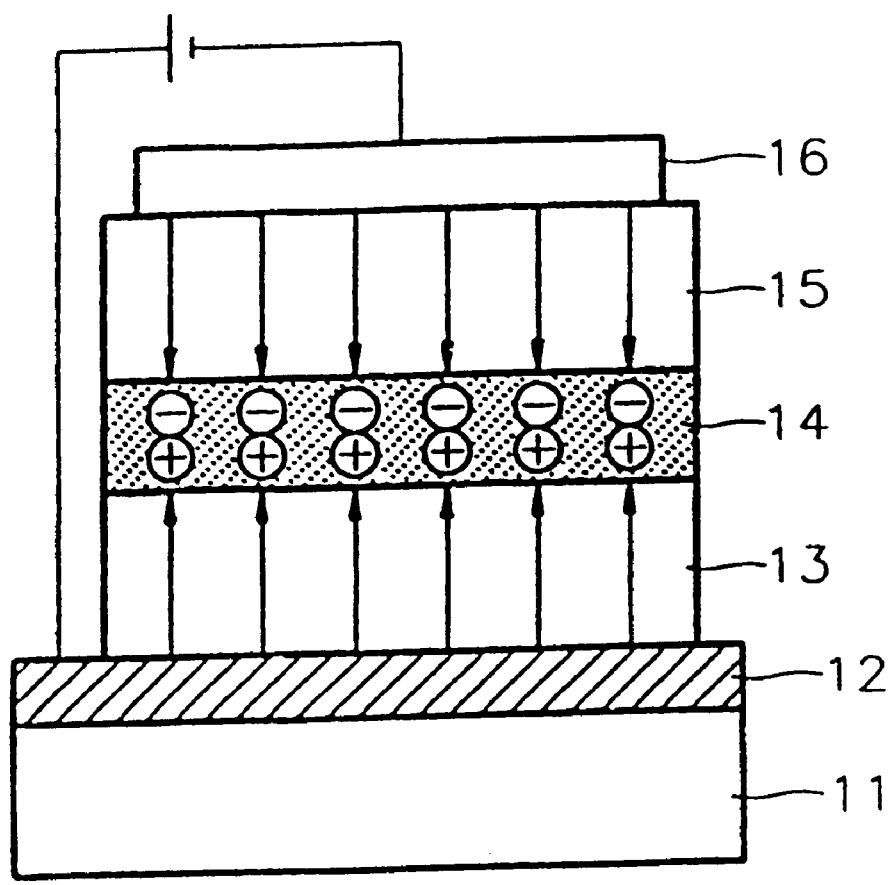
FIG. 1 is a section view showing the structure of a general organic electroluminescence (EL) device.

Most materials used for a light-emitting layer are almost insoluble in an alcoholic solvent such as a methanol. The point of the present invention is to prepare a composition for an electron transport layer, which is soluble in an alcoholic solvent, and to spin-coat the composition for an electron transport layer to form an electron transport layer. Here, the composition for the electron transport layer is formulated to be stable and soluble in alcohol, and includes an alcohol-soluble polymer and a material capable of transporting electrons.

The alcohol-soluble polymer may be a non-ionic polymer such as polyvinylpyrrolidone, polyvinylpyridine or polyethyleneoxide, or an ionic polymer such as lithium salt of polystyrene sulfonic acid containing 0.01~50% of average ion per repeating unit, sodium salt thereof, lithium salt of perfluorinated ion exchange powder (so-called Nafion (Aldrich Co.)), or sodium salt thereof. The electron transporting material is not limited to a specific compound. That is, any materials capable of transporting electrons can be used. Preferably, the electron transporting material includes 8-hydroxyquinolino-aluminum (e.g., A/Q), benzoquinolinol complex (e.g., $Bebq_2$), 1,3,4-oxadiazole derivative (e.g., PBD), triazole derivative (e.g., TAZ) or phenanthroline derivative (e.g., MEPHPH), or an ionic compound such as lithium trifluoromethanesulfonate ($LiCF_3SO_3$), lithium perchlorate ($LiClO_4$), lithium tetrafluoroborate ($LiBF_4$), lithium hexafluorophosphate ($LiPF_6$) or lithium bistrifluoromethanesulfonylamide ($LiN(CF_3SO_2)_2$), represented by the formulae.

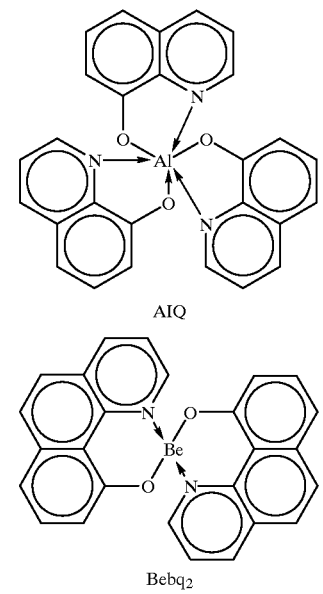

AlQ $Bebq_2$

-continued

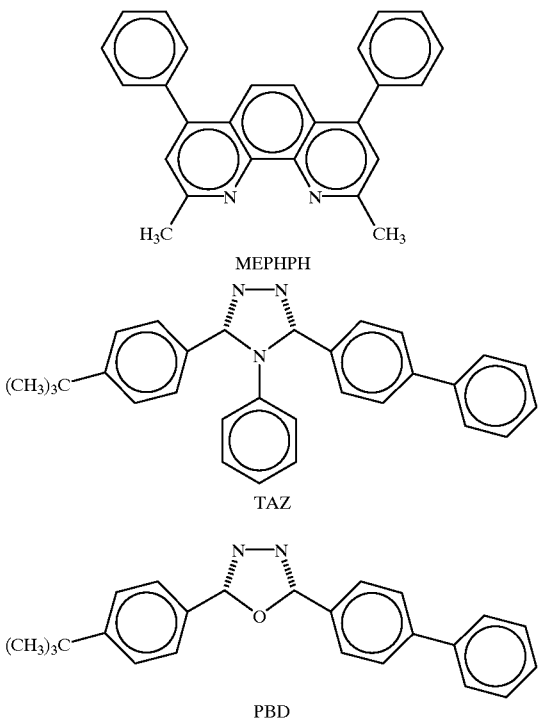

MEPHPH

TAZ

PBD

The alcohol-soluble polymer and the electron transporting material are mixed at a ratio of 50:50~99.9:0.1. Here, the content of the alcohol-soluble polymer is out of the range, formation of a film is difficult.

Hereinafter, a method for manufacturing an organic EL device according to the present invention will be described.

First, a material for an anode is coated on a substrate. Here, the substrate is a substrate used for a general organic EL device, preferably, a glass substrate or a transparent plastic substrate which is good in transparency, surface flatness, convenience in handling and waterproofing characteristic. Also, indium tin oxide (ITO), tin oxide ($SnO_2$) or zinc oxide (ZnO), which is good in transparency and conductivity, is used as a material for the anode.

The composition for the hole transport layer is spin-coated on the anode to form a hole transport layer.

The material for the hole transport layer is not limited to a specific material, which may be polyvinylcarbazole (PVK) or poly(p-phenylenevinylene) (PPV). Here, the PVK and PPV may be used as a luminous material. That is, a light-emitting layer capable of transporting holes can be formed by the PVK or PPV. Also, if necessary, an extra emitter layer may further be formed.

The composition for forming an electron transport layer according to the present invention is spin-coated on the hole transporting emitter layer. Then, the resultant structure is dried to form an electron transport layer.

The composition for the electron transport layer according to the present ski invention is prepared by mixing 50~99.9 wt % of alcohol-soluble polymer with 0.1~50 wt % of electron transporting material, and then by dissolving the mixture in an alcoholic solvent. Preferably, the alcoholic solvent includes methanol and 2-methoxyethanol.

Then, a metal for forming a cathode is vacuum-deposited or sputtered on the electron transporting layer to form a cathode, thereby completing an organic EL device. Here, the metal for a cathode is lithium (Li), magnesium (Mg), calcium (Ca), aluminum (Al), a magnesium-silver (Mg—Ag) alloy, or an Al—Li alloy.

The organic EL device is formed by stacking in sequence the anode, the hole transport layer, the light-emitting layer, the electron transport layer and the cathode as described above. Alternatively, the order of stacking the respective layers may be reversed such that the cathode, the electron transport layer, the light-emitting layer, the hole transport layer and the anode are stacked in sequence.

EXAMPLE 1

An ITO electrode was formed on a glass substrate, and a composition for a light-emitting layer, obtained by dissolving 0.1 g of MEHPPV represented by the following structural formula in 5 g of chlorobenzene, was then spin-coated on the ITO electrode to form a light-emitting layer having a thickness of 600 Å.

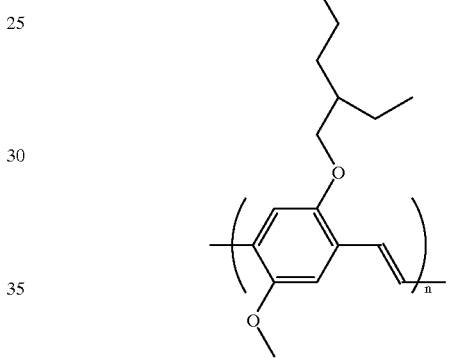

In addition, 0.01 g of polyvinylpyrrolidone and 0.005 g of A/Q were mixed, and 1.0 g of methanol was added to the mixture to prepare a composition for an electron transport layer.

The prepared composition for an electron transport layer was spin-coated on the light-emitting layer and the resultant structure was then dried, resulting in an electron transport layer having a thickness of 300 Å. Then, Al and Li were simultaneously vapor-deposited on the electron transport layer under vacuum, to form an Al/Li electrode having a thickness of 1,200 Å. As a result, an organic EL device was completed.

EXAMPLE 2

An organic EL device was manufactured by the same method as in Example 1, except that polyethyleneoxide and $LiCF_3SO_3$ were used instead of polyvinylpyrrolidone and A/Q to prepare a composition for an electron transport layer.

EXAMPLE 3

An organic EL device was manufactured by the same method as in Example 1, except that polyvinylpyridine and $LiCF_3SO_3$ were used instead of polyvinylpyrrolidone and A/Q to prepare a composition for an electron transport layer.

Comparative Example

An organic EL device was manufactured by the same method as in Example 1, except that an electron transport layer was not formed.

A turn-on voltage, luminance and color of the respective organic EL devices obtained in Example 1 through 3 and the Comparative Example were measured, and the results are shown in Table 1.

TABLE 1

| classification | turn-on voltage (V) | luminance at 10V (cd/m$^2$) | color |
| --- | --- | --- | --- |
| Example 1 | 6.0 | 200 | orange |
| Example 2 | 7.0 | 170 | orange |
| Example 3 | 7.5 | 140 | orange |
| Comparative Example | 8.0 | 50 | orange-red |

As can be understood from Table 1, the organic EL devices obtained in Examples 1 through 3 have a low turn-on voltage and show an improvement in the maximum luminance, compared to the organic EL device obtained in Comparative Example.

Also, the organic EL devices of Examples 1 through 3 can display the orange color while the organic EL device of Comparative Example displays the orange-red color.

In Examples 1 through 3, the electron transport layer is formed by a spin-coating method, so that manufacture thereof is simplified and costs and time required for the manufacture are also lowered, compared to the case of adopting a deposition method. Also, no damage to the light-emitting layer occurs, which may be caused by the solvent, e.g., methanol, used for forming the electron transport layer.

The organic EL device according to the present invention has the electron transport layer on the light-emitting layer, so that luminous efficiency is improved compared to the case in which an electron transport layer is not formed. Also, the electron transport layer can be formed through a spin-coating without damage to the light-emitting layer. Thus, the manufacture process for the organic EL device is simplified, and the time and cost required for the manufacture are reduced.

What is claimed is:

1. An organic electroluminescence (EL) device comprising an electron transport layer formed between a pair of electrodes, wherein the electron transport layer comprises about 50–99.9 wt % of alcohol-soluble polymer selected from the group consisting of polyvinylpyrrolidone, polyvinylpyridine, polyethyleneoxide, lithium and sodium salts of polystyrene sulfonic acid containing about 0.01–50% of average ion per repeating unit, and lithium and sodium salts of perfluorinated ion exchange powder, and about 0.1–50 wt % of electron transporting material selected from the group consisting of lithium trifluoromethanesulfonate (LiCF$_3$SO$_3$), lithium perchlorate (LiClO$_4$), lithium tetrafluoraborate (LiBF$_4$), lithium hexafluorophosphate (LiPF$_6$), and lithium bistrifluoromethanesulfonylamide (LiN(CF$_3$SO$_2$)$_2$).

2. An organic electroluminescence (EL) device comprising an electron transport layer formed between a pair of electrodes, wherein the electron transport layer comprises about 50–99.9 wt % of polyvinylpyridine and about 0.1–50 wt % of electron transporting material selected from the group consisting of Bebq$_2$, TAZ and MEPHPH, represented by the following structural formulae:

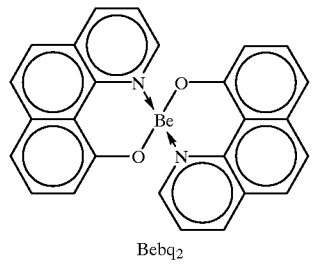
Bebq$_2$

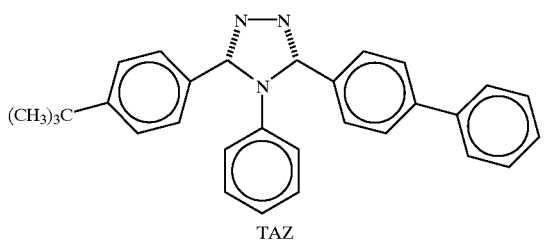
TAZ

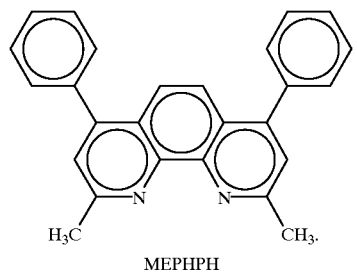
MEPHPH

3. An organic electroluminescence (EL) device comprising an electron transport layer formed between a pair of electrodes, wherein the electron transport layer comprises about 50–99.9 wt % of polyethyleneoxide and about 0.1–5 wt % of electron transporting material selected from the group consisting of Bebq$_2$, TAZ and MEPHPH, represented by the following structural formulae:

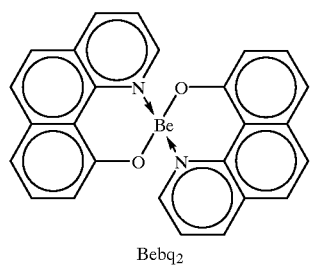
Bebq$_2$

-continued

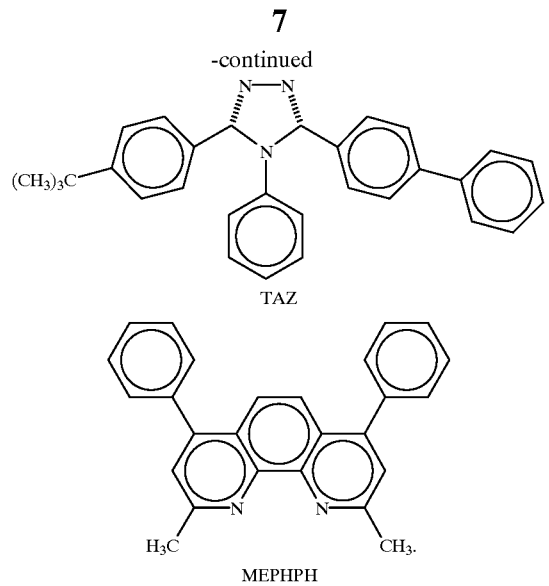

TAZ

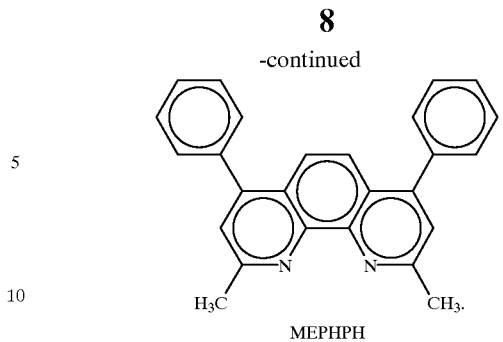

MEPHPH

4. An organic electroluminescence (EL) device comprising an electron transport layer formed between a pair of electrodes, wherein the electron transport layer comprises about 50–99.9 wt % of lithium or sodium salt of polystyrenesulfonic acid containing about 0.01–0.50 wt % of average ion per repeating unit and about 0.1–50 wt % of electron transporting material selected from the group consisting of Bebq$_2$, TAZ and MEPHPH, represented by the following structural formulae:

5. An organic electroluminescence (EL) device comprising an electron transport layer formed between a pair of electrodes, wherein the electron transport layer comprises about 50–99.9 wt % of lithium or sodium salt of perfluorinated ion exchange powder and about 0.1–50 wt % of electron transporting material selected from the group consisting of Bebq$_2$, TAZ and MEPHPH, represented by the following structural formulae:

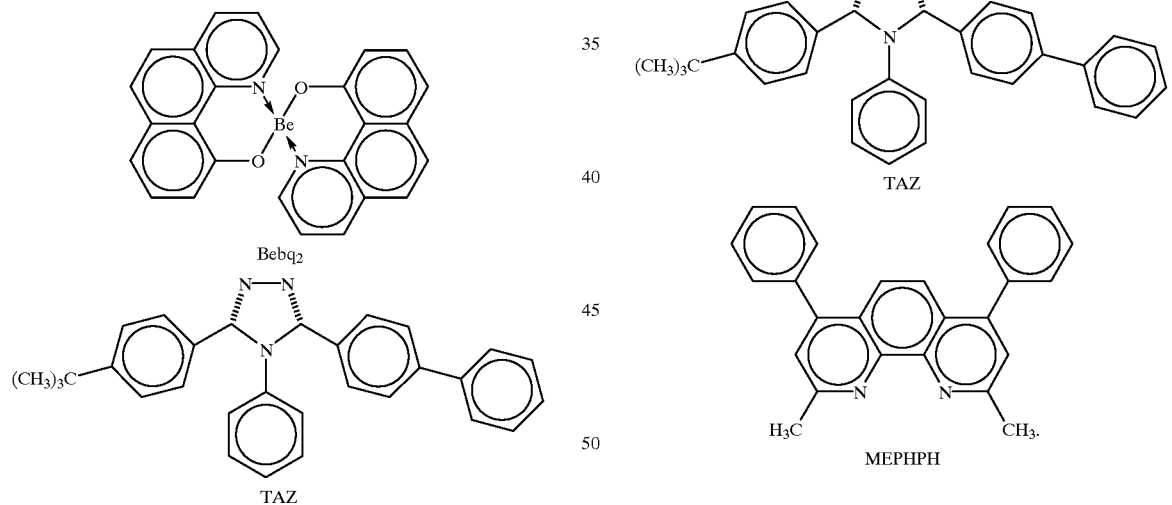

* * * * *